(12) United States Patent
Sakoh

(10) Patent No.: US 7,826,272 B2
(45) Date of Patent: Nov. 2, 2010

(54) SEMICONDUCTOR MEMORY DEVICE

(75) Inventor: Takashi Sakoh, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 249 days.

(21) Appl. No.: 11/889,159

(22) Filed: Aug. 9, 2007

(65) Prior Publication Data

US 2008/0037335 A1 Feb. 14, 2008

(30) Foreign Application Priority Data

Aug. 10, 2006 (JP) ............................. 2006-218268
Jun. 7, 2007 (JP) ............................. 2007-151194

(51) Int. Cl.
*G11C 16/06* (2006.01)

(52) U.S. Cl. ............................. 365/185.2; 365/185.21; 365/185.22; 365/185.25; 365/189.09; 365/210.1; 365/210.12; 365/210.15; 365/149

(58) Field of Classification Search ............. 365/185.2, 365/185.21, 185.22, 185.25, 189.09, 210.1, 365/210.12, 210.15, 149
See application file for complete search history.

(56) References Cited

U.S. PATENT DOCUMENTS

| | | | | |
|---|---|---|---|---|
| 4,931,849 A | * | 6/1990 | Tajima | 257/296 |
| 5,321,660 A | * | 6/1994 | Sani et al. | 365/189.11 |
| 5,504,452 A | * | 4/1996 | Takenaka | 327/541 |
| 5,781,481 A | * | 7/1998 | Iwakiri | 365/189.11 |
| 6,809,986 B2 | * | 10/2004 | Kim et al. | 365/230.06 |
| 6,906,951 B2 | * | 6/2005 | Wong | 365/185.03 |
| 2003/0081447 A1 | * | 5/2003 | Hsu et al. | 365/149 |
| 2004/0008556 A1 | * | 1/2004 | Hidaka | 365/210 |
| 2006/0181917 A1 | * | 8/2006 | Kang et al. | 365/149 |

FOREIGN PATENT DOCUMENTS

| | | |
|---|---|---|
| JP | 2002-015562 | 1/2002 |
| JP | 2003-288781 | 10/2003 |

* cited by examiner

*Primary Examiner*—Richard Elms
*Assistant Examiner*—Eric Wendler
(74) *Attorney, Agent, or Firm*—McGinn IP Law Group PLLC

(57) ABSTRACT

The present invention solves a problem of the degradation of the long-term reliability of a conventional semiconductor memory device due to early deterioration of a FET included in a reference cell therein. DRAM 1 has word lines $10_1$ to $10_n$, word lines 22 and 24, memory cells $30_1$ to $30_n$ and a reference cell 40. Gates of FETs 32 in the memory cells $30_1$ to $30_n$ are connected to the word lines $10_1$ to $10_n$ respectively. Gates of a FET 42 and a FET 44 in the reference cell 40 are connected to the word line 22 for readout and the word line 24 for writing respectively. Here, potentials applied to the word lines 22 and 24 are lower than those applied to the word lines $10_1$ to $10_n$.

18 Claims, 9 Drawing Sheets

RELATED ART

SEMICONDUCTOR MEMORY DEVICE

BACKGROUND OF THE INVENTION

1. Field of the Invention

The present invention relates to a semiconductor memory device.

2. Description of Related Art

There are some semiconductor memory devices which read out a datum stored in a memory cell by comparing the datum with that in a reference cell. For instance, a sense-amplifier system which is used for reading out the datum in an embedded DRAM and a general-purpose DRAM is classified into three types according to voltage during standby, which are a $V_{cc}$ pre-charge type, a $½V_{cc}$ pre-charge type and a GND pre-charge type. Among them, the $V_{cc}$ pre-charge type and the GND pre-charge type require the reference cell for comparing the datum in the memory cell when reading out the datum.

FIG. 9 is a circuit diagram presenting a conventional DRAM. A DRAM 100 is provided with memory cells $103_1$ to $103_n$ connected to a digit line 101, and a reference cell 104 connected to a digit line 102, wherein (n) is an integer of two or more, such as 128 or 256. The digit lines 101 and 102 are connected to an input terminal of a sense amplifier 108.

Each of memory cells $103_1$ to $103_n$ is a 1T1C (1 transistor 1 capacitor) type memory cell, and has one field-effect transistor (FET) and one capacitor. Gates of the field-effect transistors in the memory cells $103_1$ to $103_n$ are connected to word lines $105_1$ to $105_n$ respectively. The reference cell 104 has two field-effect transistors and one capacitor. The gates of the field-effect transistors are connected to the word line 106 for readout and the word line 107 for writing respectively.

A readout operation of DRAM 100 will now be described. At first, the DRAM 100 writes a reference voltage in the reference cell 104 by turning the word line 107 on. The reference voltage is about $½V_{cc}$ (one-half of power supply voltage). Subsequently, the DRAM 100 turns the word line 107 off, and turns the word line 106 and the word line $105_1$ on. Then, the sense amplifier 108 compares voltage accumulated in the memory cell $103_1$ with reference voltage accumulated in the reference cell 104, and reads out a datum from the memory cell $103_1$ according to the comparison result. The DRAM 100 can read out data from the memory cells $103_2$ to $103_n$ as well, by similarly operating the other memory cells $103_2$ to $103_n$.

Japanese Patent Laid-Open No. 2003-288781 (Patent Document 1) and Japanese Patent Laid-Open No. 2002-15562 (Patent Document 2) are prior art documents related to the present invention.

However, word lines 106 and 107 connected to a reference cell 104 in DRAM 100 in FIG. 9 receive the potential more frequently than word lines $105_1$ to $105_n$ connected to memory cells $103_1$ to $103_n$. For instance, in consideration of the case when each of the memory cells $103_1$ to $103_n$ is read out one-by-one, the potential is applied to each of the word lines $105_1$ to $105_n$ only one time, whereas the potential is applied to each of the word lines 106 and 107 by the number of times (n). Accordingly, the FETs included in the reference cell 104 early deteriorate to lower the long-term reliability of DRAM 100.

SUMMARY

A semiconductor memory device according to one embodiment is provided with a first word line, a second word line, a memory cell connected to the first word line, and a reference cell connected to the second word line, wherein a second potential applied to the second word line is lower than a first potential applied to the first word line.

A semiconductor memory device according to another embodiment is provided with a first word line, a second word line, a memory cell connected to the first word line, and a reference cell connected to the second word line, wherein a second writing potential applied to the second word line upon a data writing operation is lower than a first writing potential applied to the first word line upon the data writing operation.

A semiconductor memory device according to another embodiment is provided with a first word line, a second word line, a memory cell connected to the first word line, and a reference cell connected to the second word line, wherein a second readout potential applied to the second word line upon a data reading operation is lower than a first readout potential applied to the first word line upon the data reading operation.

In this semiconductor memory device, a potential applied to a word line (second word line) connected to a reference cell is lower than that applied to a word line (first word line) connected to a memory cell. Thereby, the semiconductor memory device can suppress the deterioration of a transistor included in the reference cell.

The present invention can provide a semiconductor memory device having a high degree of long-term reliability.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Figure 1:
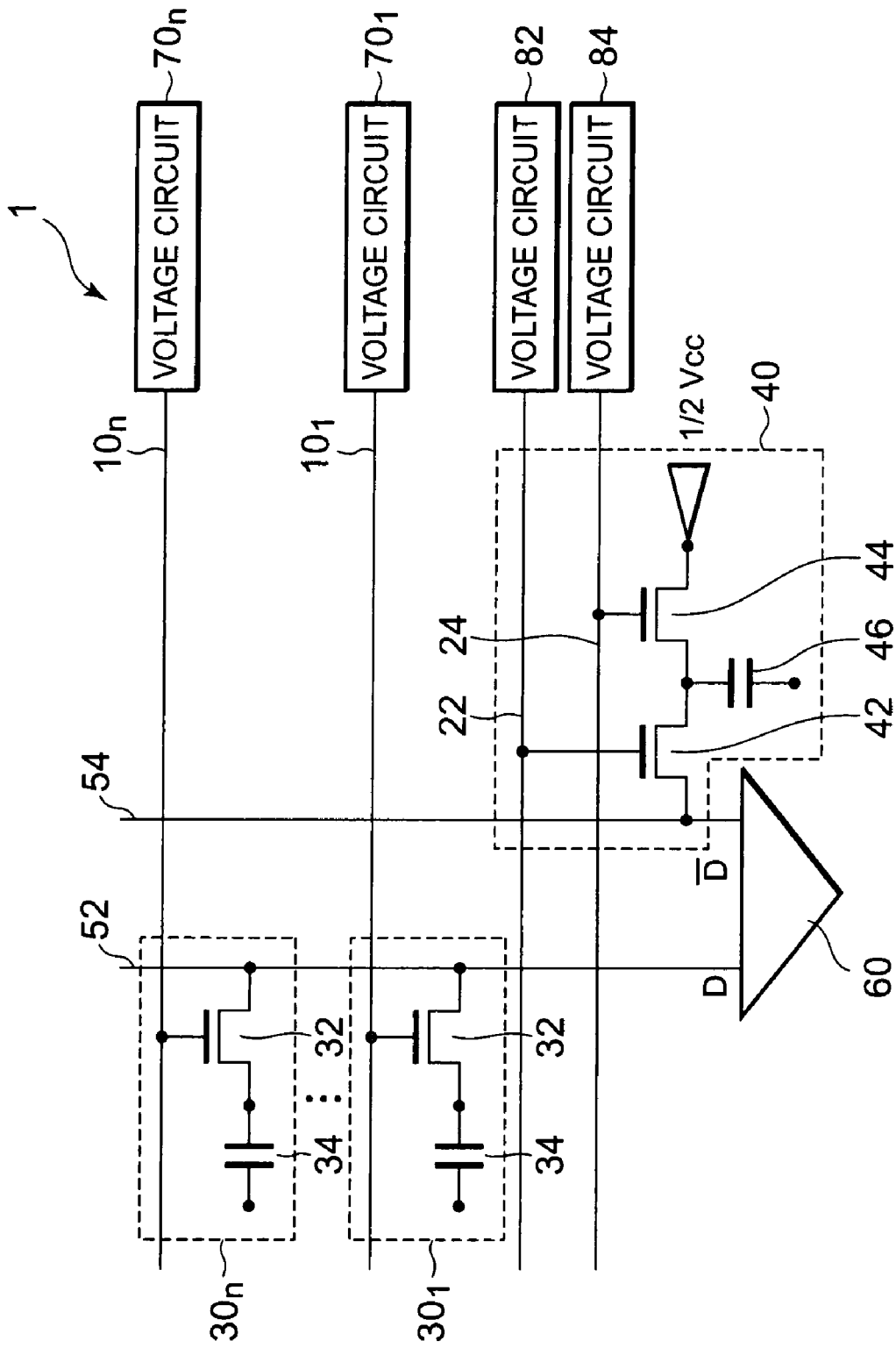
FIG. 1 is a circuit diagram illustrating a first embodiment of a semiconductor memory device according to the present invention.

Preferred embodiments of a semiconductor memory device according to the present invention will now be described in detail with reference to the drawings. In the description for the drawings, the same reference numeral will be put on the same element and the description on the same element will be omitted.

First Embodiment

FIG. 1 is a circuit diagram illustrating a first embodiment of a semiconductor memory device according to the present invention. A DRAM 1 is provided with word lines (first word lines) $10_1$ to $10_n$, word lines (second word lines) 22 and 24, memory cells $30_1$ to $30_n$ and a reference cell 40, and reads out data (0 or 1) stored in the memory cells $30_1$ to $30_n$ according to a result of having compared respective voltages of the memory cells $30_1$ to $30_n$ with the voltage of the reference cell 40.

Each of memory cells $30_1$ to $30_n$ has a FET 32, and a capacitor 34 connected to a source of the FET 32. Gates of the FETs 32 in the memory cells $30_1$ to $30_n$ are connected to word lines $10_1$ to $10_n$ respectively. In addition, a drain of the FET 32 is connected to a digit line 52 (first digit line).

The reference cell 40 has FETs 42 and 44, and a capacitor 46. A drain of the FET 42 is connected to a source of the FET 44, and the capacitor 46 is connected to the connecting point therebetween. The gates of the FET 42 and FET 44 are connected to a word line 22 for readout and the word line 24 for writing respectively. In addition, a source of the FET 42 is connected to a digit line 54 (second digit line). A reference voltage to be written in the reference cell 40 is applied to a drain of the FET 44. The amplitude of the reference voltage is about ½ $V_{cc}$.

In the present embodiment, a plurality of memory cells (memory cells $30_1$ to $30_n$) are connected to one digit line 52 and one reference cell (reference cell 40) is connected to one digit line 54. The digit line 52 and the digit line 54 are connected to first and second input terminals of a sense amplifier 60 respectively. The sense amplifier 60 compares voltage accumulated in each of the memory cells $30_1$ to $30_n$ with voltage accumulated in the reference cell 40 to determine which is higher, and outputs the result.

Voltage circuits (first potential circuit) $70_1$ to $70_n$ are connected to the word lines $10_1$ to $10_n$ respectively. The voltage circuits $70_1$ to $70_n$ apply a predetermined potential (first readout potential) to the word lines $10_1$ to $10_n$ to turn the word lines $10_1$ to $10_n$ on, when the DRAM reads out voltage from the memory cells $30_1$ to $30_n$ respectively. The voltage circuits $70_1$ to $70_n$ also apply a predetermined potential (first writing potential) to the word lines $10_1$ to $10_n$ and turn the word lines $10_1$ to $10_n$ on, when the DRAM writes voltage in the memory cells $30_1$ to $30_n$ respectively. In the above operation, the first readout potential may be equal to or different from the first writing potential.

Voltage circuits 82 and 84 (second voltage circuits) are connected to the word lines 22 and 24 respectively. The voltage circuit 82 applies a predetermined potential (second readout potential) to the word line 22, when the DRAM reads out the voltage from the reference cell 40 and turns the word line 22 on. The voltage circuit 84 applies a predetermined potential (second writing potential) to the word line 24 and turns the word line 24 on, when the DRAM writes the voltage in the reference cell 40. In the above operation, the second readout potential may be equal to or different from the second writing potential.

Here, the second readout potential is lower than the first readout potential. The former potential is preferably 0.7 times or more than but less than the latter potential. Similarly, the second writing potential is lower than the first writing potential. The former potential is preferably 0.7 times or more than but less than the latter potential.

Figure 2A:
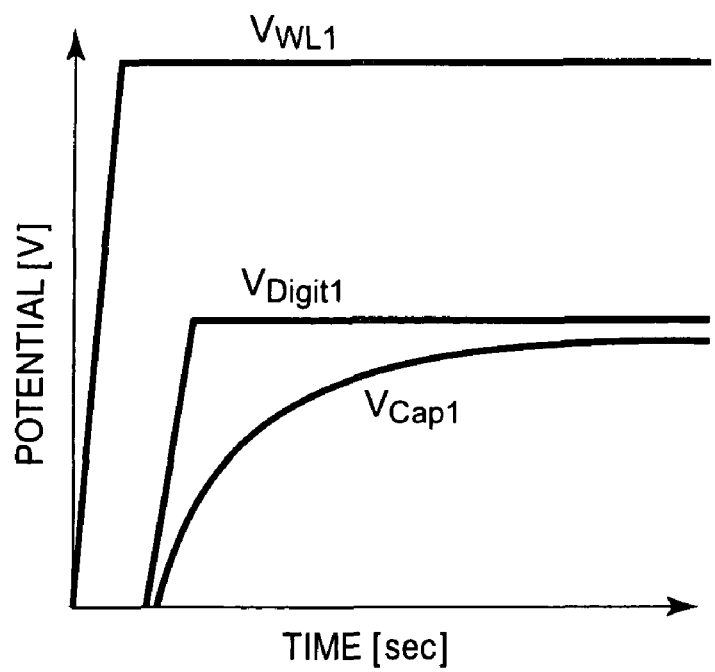
FIGS. 2A and 2B are graphs for describing an operation of a semiconductor memory device in FIG. 1.

An operation of DRAM 1 will now be described. When writing voltage in the memory cell $30_1$ for instance, the DRAM 1 applies the voltage to be written in the memory cell $30_1$ to the digit line 52, in a state of turning the word line $10_1$ on. Thereby, the voltage of the capacitor 34 goes up as shown in FIG. 2A. In the figure, reference characters $V_{WL1}$, $V_{Digit1}$ and $V_{Cap1}$ denote the potentials of the word line $10_1$, the digit line 52 and the capacitor 34 (electrode in the FET 32 side) respectively. Among them, $V_{WL1}$ corresponds to the above described first writing potential. Subsequently, the DRAM 1 turns the word line $10_1$ off to accumulate the voltage in the capacitor 34 and complete writing into the memory cell $30_1$. In the same way, the DRAM 1 can write voltage in the other memory cells $30_2$ to $30_n$ as well.

Figure 2B:
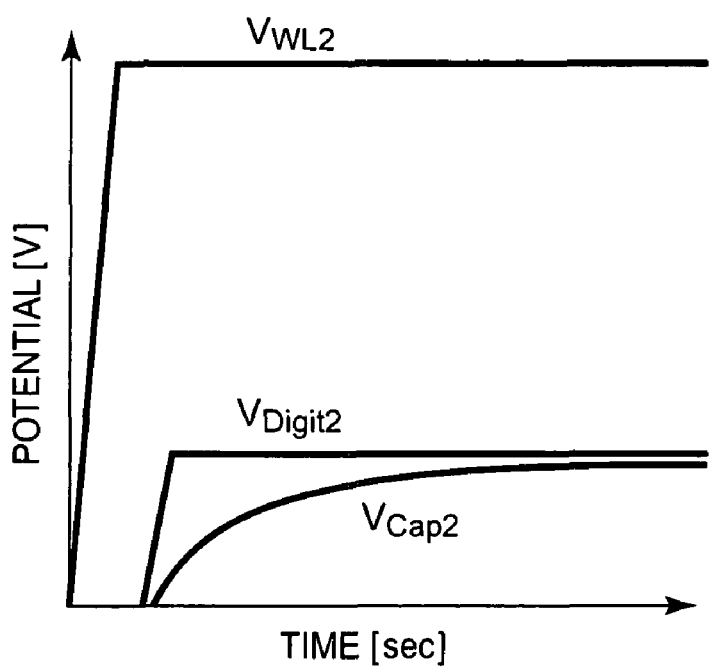

When reading out voltage from the memory cell $30_1$, the DRAM 1 firstly applies a reference voltage to a drain of the FET 44 in a state of turning the word line 24 on. Thereby, the voltage of the capacitor 46 goes up as shown in FIG. 2B. In the figure, reference characters $V_{WL2}$, $V_{Digit2}$ and $V_{Cap2}$ denote the potentials of the word line 24, the drain of the FET 44 and the capacitor 46 (electrode in the FETs 42 and 44 side) respectively. Among them, $V_{WL2}$ corresponds to the above described second writing potential.

Next, the DRAM 1 turns the word line 24 off, and turns the word line $10_1$ and the word line 22 on. Potentials applied to the word line $10_1$ and the word line 22 in the above operation are the above described first and second readout potentials. Then, voltages are read out from the memory cell $30_1$ and the reference cell 40 respectively and the voltages are compared with each other by the sense amplifier 60. Thereby, a datum in the memory cell $30_1$ is read out. The DRAM 1 can read out data from the memory cells $30_2$ to $30_n$ as well, by similarly operating the other memory cells $30_2$ to $30_n$.

An effect of the present embodiment will now be described. In DRAM 1, a second readout potential applied to the word line 22 which is connected to the reference cell 40 is lower than a first readout potential applied to the word lines $10_1$ to $10_n$ which are connected to the memory cells $30_1$ to $30_n$. Thereby, the DRAM 1 can inhibit the deterioration of the FET 42 included in the reference cell 40. Accordingly, the DRAM 1 can realize high long-term reliability.

Furthermore, a second writing potential applied to the word line 24 is lower than a first writing potential applied to the word lines $10_1$ to $10_n$. Thereby, the DRAM 1 can inhibit the deterioration of the FET 44 as well, which is included in the reference cell 40.

In the above described example, both of a second readout potential and a second writing potential are lower than a first readout potential and a first writing potential respectively, but only one of the second potentials may be lower than the first potentials. Specifically, it is also acceptable to equalize the first readout potential to the second readout potential and make the second writing potential lower than the first writing potential. In this case, the DRAM 1 can inhibit the deterioration of the FET 44 included in the reference cell 40. Alternatively, it is also acceptable to equalize the first writing potential to the second writing potential and make the second readout potential lower than the first readout potential. In this case, the DRAM 1 can inhibit the deterioration of the FET 42 included in the reference cell 40.

FIG. 1 shows a configuration in which the voltage circuits $70_1$ to $70_n$, 82 and 84 are arranged in respective word lines, but the configuration is shown so as to describe that voltages each can independently be set. It is also possible to equalize the first readout potential to the first writing potential, equalize the second readout potential to the second writing potential, and set the latter potential at 0.7 times the former potential. Then, the circuit configuration needs to input only two levels of voltages into the word line, and needs not make itself especially complicated in comparison with the conventional configuration.

Figure 3:
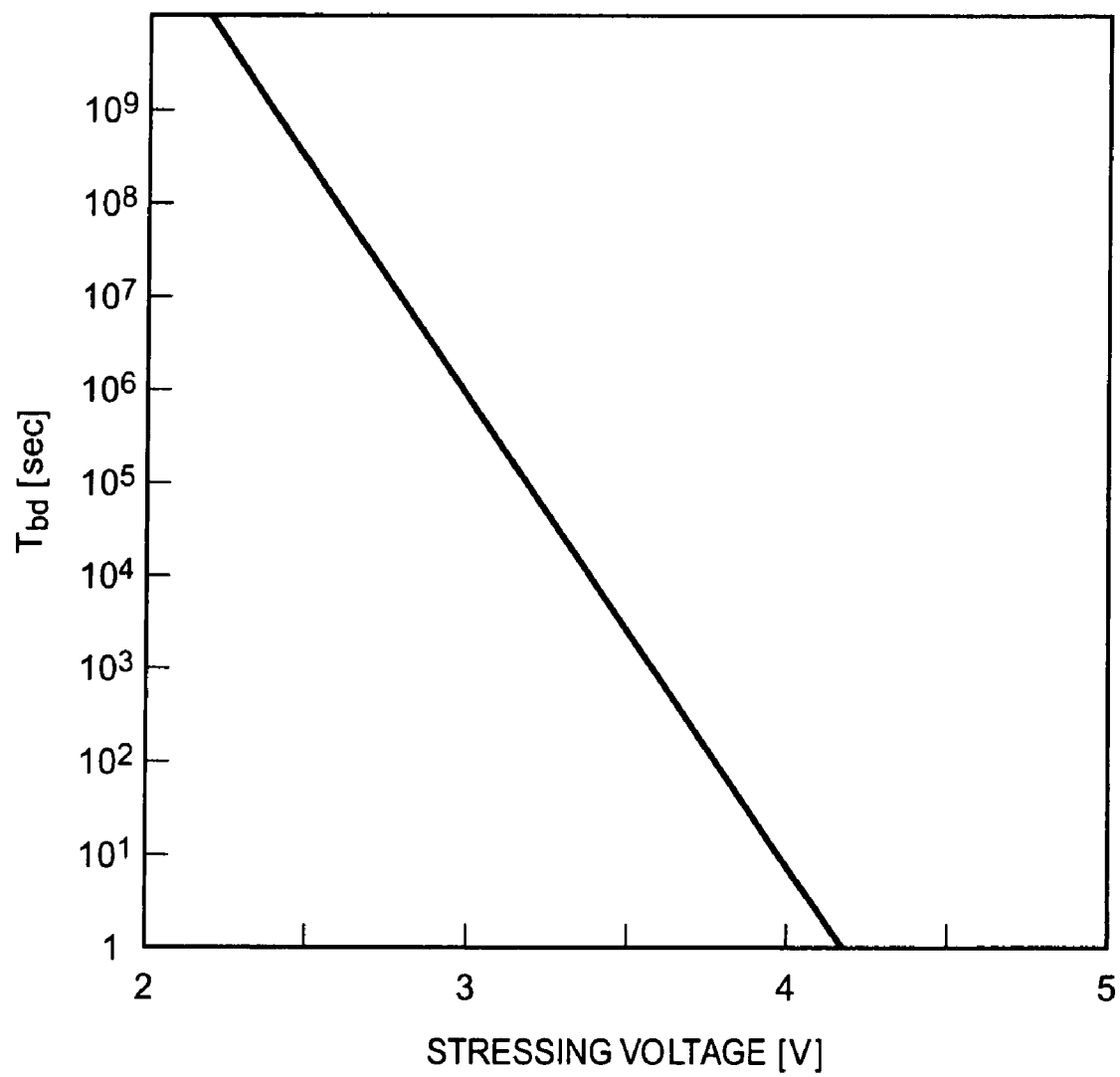
FIG. 3 is a graph for describing an effect of a semiconductor memory device in FIG. 1.

FIG. 3 is a graph illustrating a relationship between a period before the breakdown of an insulating film and a stressing voltage. A vertical axis of the graph represents the breakdown period $T_{bd}$ (total period in which the stressing voltage has been applied before insulation breakdown occurs), and a transverse axis represents the stressing voltage. It is understood that the smaller is the stressing voltage applied to the insulating film, the longer is the period before the insulating film causes breakdown. For this reason, the DRAM 1 in the present embodiment which sets a second readout potential and a second writing potential lower than first those can inhibit the deterioration of the transistors included in the reference cell 40.

The amplitude of reference voltage written in the reference cell 40 is about $\frac{1}{2} V_{cc}$. Accordingly, the DRAM 1 can readout a datum from the reference cell 40 and write a datum to the reference cell 40 without any problems, even though having set a second readout potential and a second writing potential so small as described above.

Figure 4:
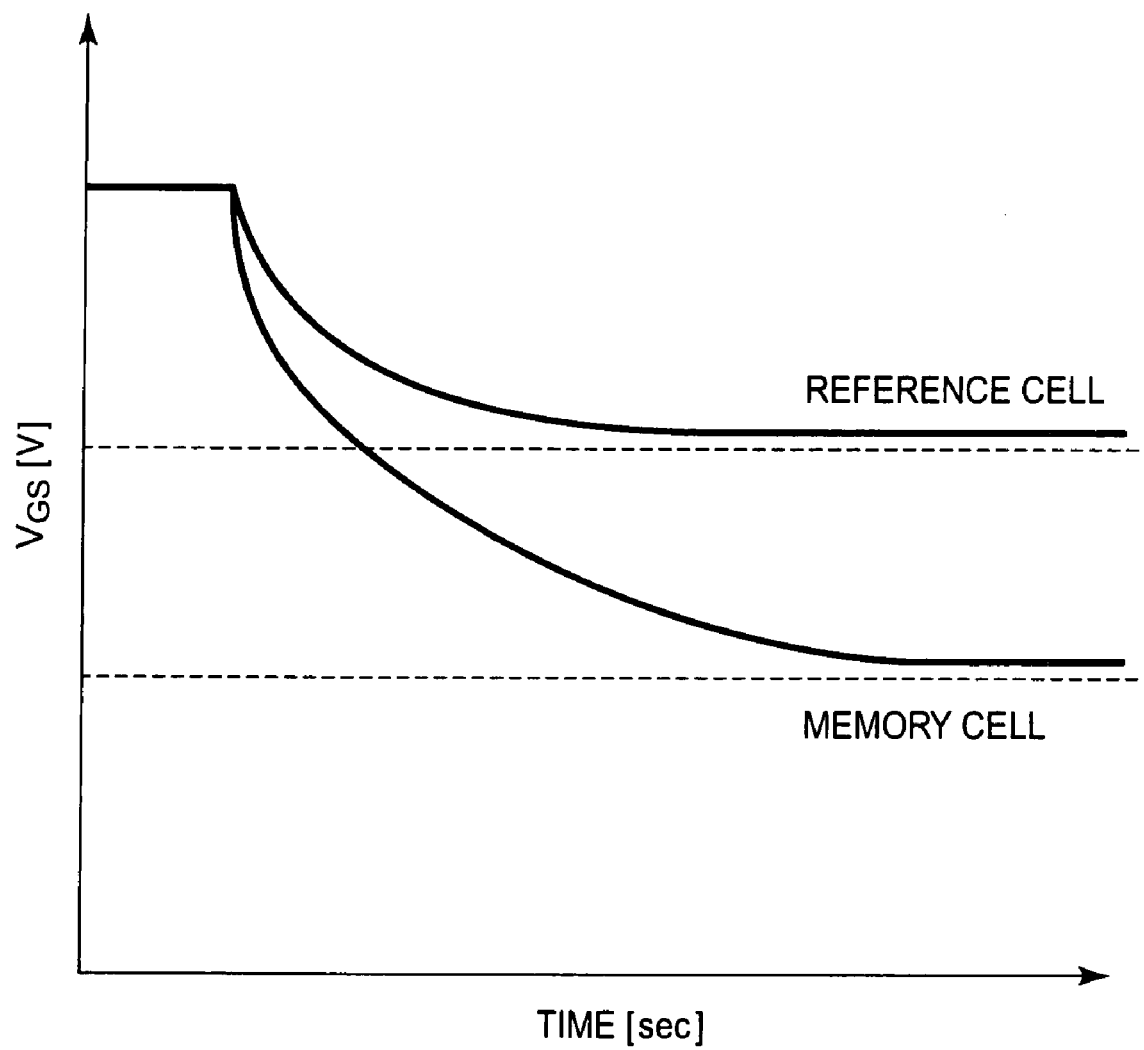
FIG. 4 is a graph for describing an effect of a semiconductor memory device in FIG. 1.
Figure 5:
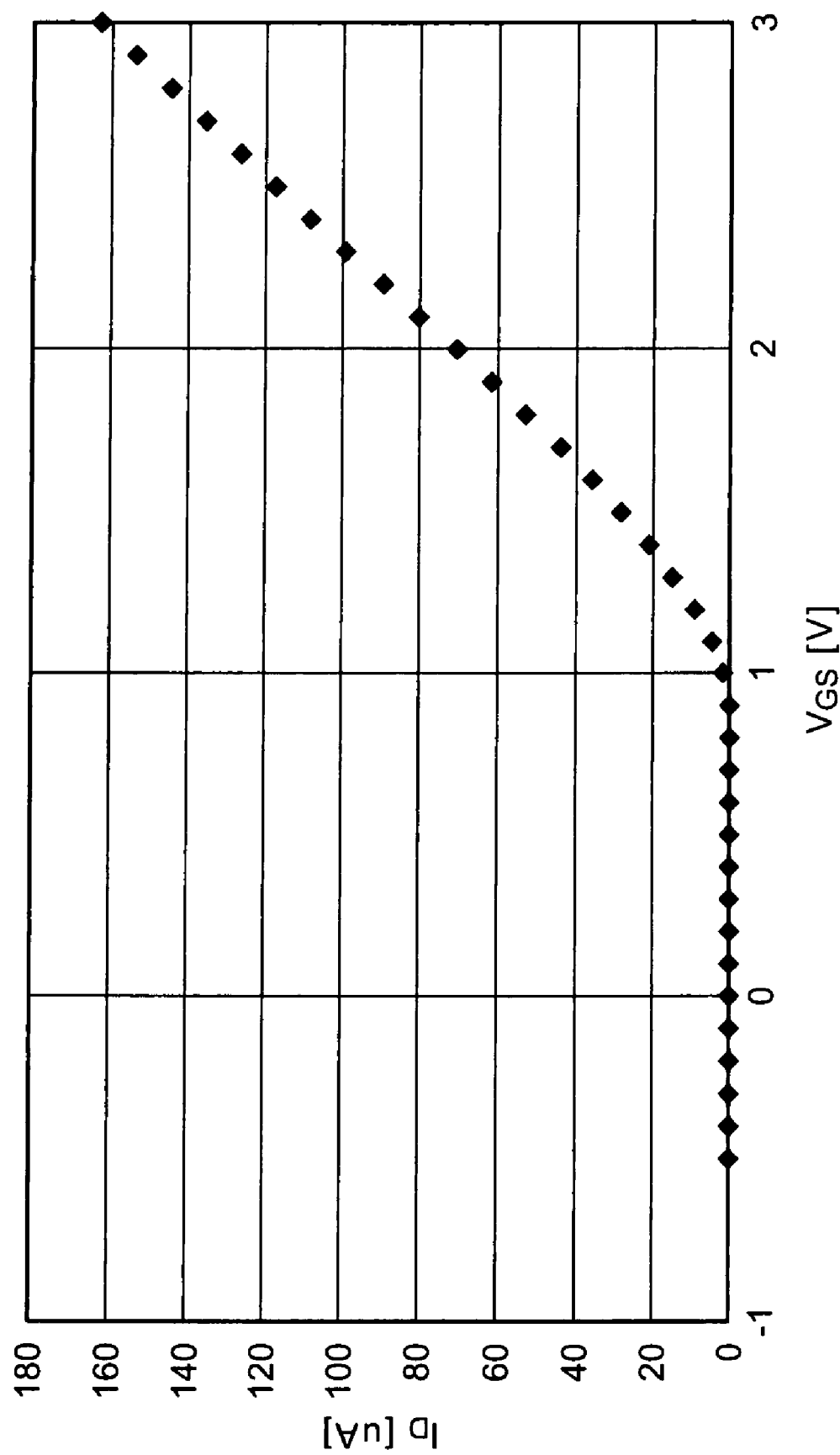
FIG. 5 is a graph for describing an effect of a semiconductor memory device in FIG. 1.

The reason of the above point will be described with reference to FIG. 4 and FIG. 5. FIG. 4 is a graph illustrating a change with time of voltage $V_{GS}$ generated between a gate and a sauce of a FET in the memory cell $30_1$ and the FET 44 of the reference cell 40. The $V_{GS}$ for the memory cell is equal to a potential difference between $V_{WL1}$ and $V_{Cap1}$ in FIG. 2A, and the $V_{GS}$ for the reference cell is equal to a potential difference between $V_{WL2}$ and $V_{Cap2}$ in FIG. 2B. As is illustrated in FIG. 5, as the $V_{GS}$ decreases, an electric current passing through the FET decreases. Accordingly, in order to readout or write data without any problems, the DRAM needs to reliably acquire a certain intensity of the $V_{GS}$. In FIG. 5, an ordinate axis and an abscissa axis represent a drain current $I_D$ and the $V_{GS}$ respectively.

Here, suppose that $V_{WL1}$ is equal to $V_{WL2}$. Then, after a sufficient period of time has elapsed, a value of $V_{GS}$ in the reference cell is larger than that in the memory cell, as is illustrated in FIG. 4. For instance, assume that relations $V_{WL1}=V_{WL2}=2.5$ V, $V_{Digit1}=1.0$ V and $V_{Digit2}=0.5$ V exist in FIG. 2A and FIG. 2B. Then, after the sufficient period of time has elapsed, the $V_{GS}$ in the memory cell is a little over 1.5 V and the $V_{GS}$ in the reference cell is a little over 2.0 V in FIG. 4. Thus, the $V_{GS}$ of the reference cell is larger than that of the memory cell only by a differential between $V_{Digit1}$ and $V_{Digit2}$. Accordingly, it is possible to control the $V_{GS}$ of the reference cell equal to or larger than that of the memory cell, even though $V_{WL2}$ is controlled to be lower than $V_{WL1}$ as in the present embodiment. In the above described example, the DRAM can write a datum in the reference cell without any problem even when the $V_{WL2}$ is lowered into about 0.5 V. Generally, a power supply voltage $V_{cc}$ is applied to $V_{Digit1}$. Accordingly, when $V_{Digit1}$ is 1.0 V in the above described example, 0.5 V that is $\frac{1}{2} V_{cc}$ is applied to $V_{Digit2}$.

If a second readout potential is 0.7 times or more but less than a first readout potential, the DRAM can readout the datum from the reference cell 40 without any problem in many cases, though it depends on a value of a potential applied to the digit line 52. Similarly, if a second writing potential is 0.7 times or more but less than a first writing potential, the DRAM can write the datum into the reference cell 40 without any problem in many cases.

Preferred combinations of potentials will now be exemplified below. $V_M$ represents a first readout potential and a first writing potential, $V_{Digit}$ represents a potential applied to the digit line 52, and $V_R$ represents a second readout potential and a second writing potential. All the units of the potentials are Volt.

(i) When a gate insulating film has a thickness of 4.6 to 6.0 nm,
$V_M=3.0$, $V_{Digit}=1.5$ and $V_R=2.2$ to 2.9;
$V_M=3.0$, $V_{Digit}=1.2$ and $V_R=2.4$ to 2.9;
$V_M=3.0$, $V_{Digit}=1.0$ and $V_R=2.5$ to 2.9;
$V_M=2.7$, $V_{Digit}=1.5$ and $V_R=1.9$ to 2.6;
$V_M=2.7$, $V_{Digit}=1.2$ and $V_R=2.1$ to 2.6; and
$V_M=2.7$, $V_{Digit}=1.0$ and $V_R=2.2$ to 2.6.

(ii) When the gate insulating film has a thickness of 3.0 to 4.5 nm,
$V_M=2.2$, $V_{Digit}=1.2$ and $V_R=1.6$ to 2.1;
$V_M=2.2$, $V_{Digit}=1.0$ and $V_R=1.7$ to 2.1;
$V_M=2.0$, $V_{Digit}=1.2$ and $V_R=1.4$ to 1.9; and
$V_m=2.0$, $V_{Digit}=1.0$ and $V_R=1.5$ to 1.9.

Incidentally, Patent Documents 1 and 2 disclose a technology for preventing the deterioration of a reference cell in a semiconductor memory device. Patent Document 1 discloses that when having accessed to one reference cell as many times as exceeding a predetermined number, a DRAM accesses to the other reference cell. Patent Document 2 discloses a DRAM in which one reference cell is arranged so as to correspond to one memory cell and frequencies of access to both cells are equalized.

However, both of these technologies have a problem of increasing an overhead for an arrangement area. This is because the technology in Patent Document 1 additionally needs a counter circuit, a circuit for selecting a reference cell and a reference cell to be newly used. In addition, this is because the technology in Patent Document 2 needs the same number of reference cells as that of memory cells. In contrast to them, the DRAM according to the present embodiment can inhibit the deterioration of a transistor included in the reference cell without increasing the overhead for the arrangement area, because of inhibiting the deterioration of the transistor by lowering an operating voltage of the reference cell. In fact, the DRAM 1 has only one reference cell 40 arranged for (n) pieces of memory cells $30_1$ to $30_n$.

Second Embodiment

Figure 6:
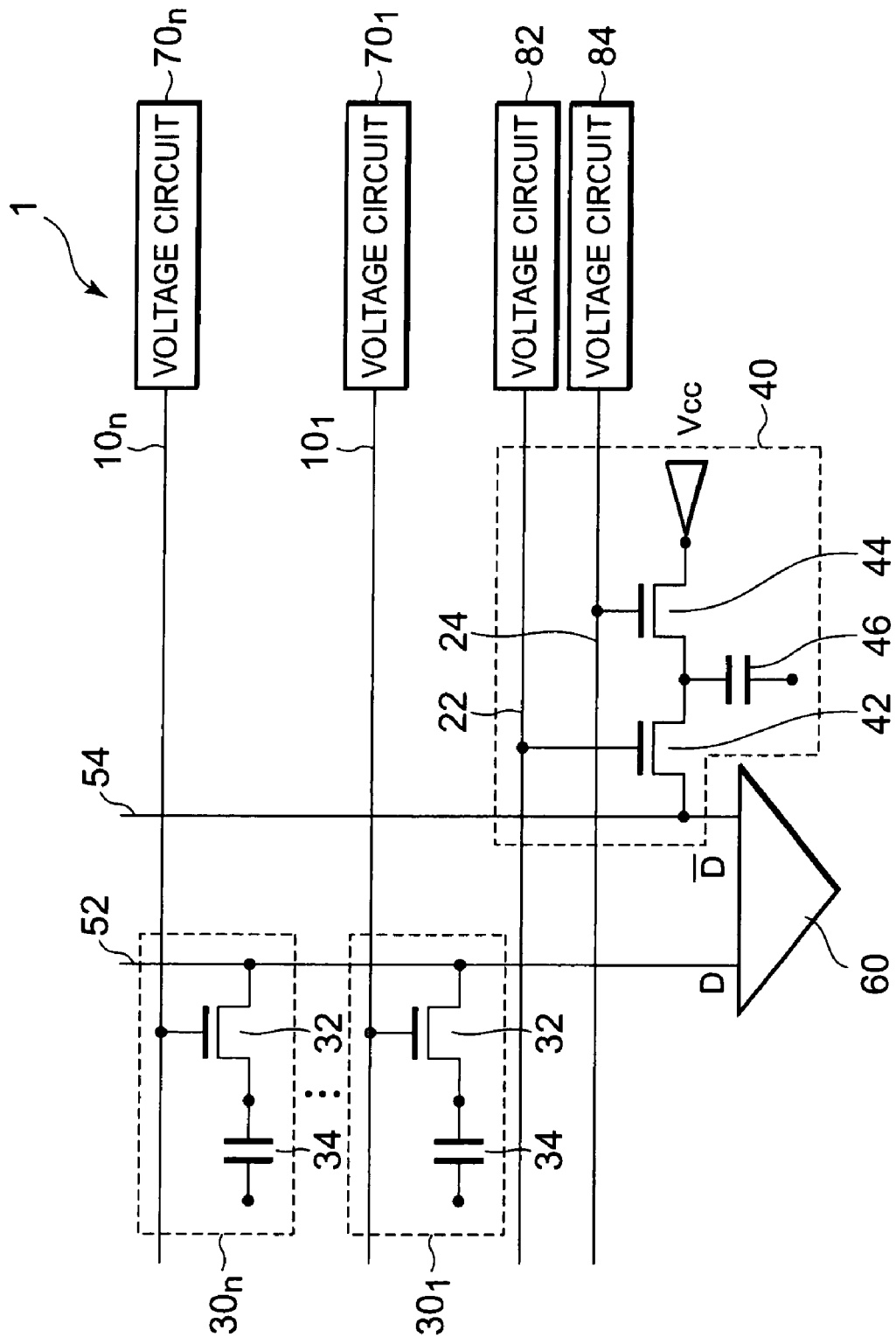
FIG. 6 is a circuit diagram illustrating a second embodiment of a semiconductor memory device according to the present invention.

In the next place, a second embodiment according to the present invention will be described. FIG. 6 is a circuit diagram illustrating a semiconductor memory device according to the second embodiment. The semiconductor memory device has the same configuration as in FIG. 1 except that a reference voltage to be written in a reference cell 44 is $V_{cc}$ which is different from that in FIG. 1. In addition, a first readout potential, a first written potential and an operation for writing voltage in memory cells $30_1$ to $30_n$ are the same as in the first embodiment, so that the description will be omitted.

A different point from the semiconductor memory device in the first embodiment is that a second writing potential may be less than 0.7 times a first writing potential, and for instance, is set at a power supply voltage $V_{cc}$. The $V_{cc}$ is smaller than the first writing potential, and in general, the $V_{cc}$ is less than 0.7 times the first writing potential. For instance, when the first writing potential is 2.5 V and $V_{cc}$ is 1.0 V, the second writing potential that is $V_{cc}$, is 0.4 times the first writing potential. A second readout potential may be set at a value which is 0.7 times or more but less than a first readout potential, as in the case of the first embodiment, but is not limited to the value in particular. The second readout potential may be equal to the first readout potential as well.

The semiconductor memory device according to the present embodiment can make $V_{cc}$ lower than a first writing potential and further can make the $V_{cc}$ lower than 0.7 times the first writing potential; and thereby can more strongly inhibit the deterioration of a FET 44 included in a reference cell 40 than that in the first embodiment.

Furthermore, when setting $V_{cc}$ at 1.0 V, the semiconductor memory device can commonize all of a voltage $V_{Digit1}$ applied to a digit line 52, a potential $V_{WL2}$ applied to a word line 24 corresponding to the second writing potential and a reference voltage applied to the reference cell 40 into 1.0 V that is the $V_{cc}$; does not need such a circuit for generating ½ $V_{cc}$ as in the first embodiment; can simplify a circuit configuration; and consequently can reduce a chip area. Furthermore, when equalizing all of the second readout potential, the first readout potential and the first writing potential, the semiconductor memory device can equalize a potential to be applied to word lines $10_1$ to $10_n$ to a potential to be applied to a word line 22; can further simplify the circuit configuration; and can further reduce the chip area.

Figure 7A:
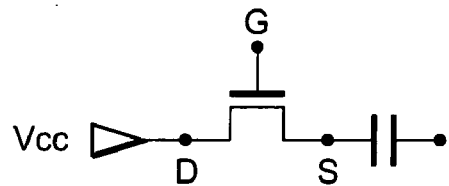
FIGS. 7A, 7B and 7C are circuit diagrams and graphs for describing an operation of a second embodiment.
Figure 7B:
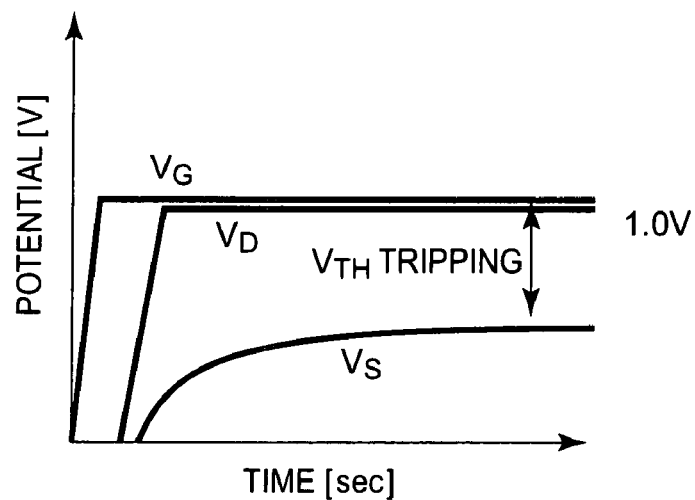
Figure 7C:
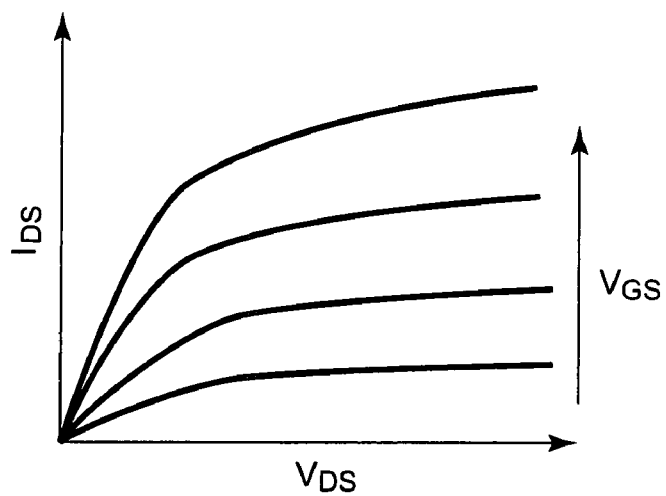

Next, the reason will be described why the semiconductor memory device even in the present embodiment can read out data in the memory cells $30_1$ to $30_n$, specifically, can obtain a reference voltage from a reference cell, which is necessary for reading out a datum in the memory cell. FIG. 7A illustrates the FET 44 and a capacitor 46 included in the reference cell 40 excerpted from FIG. 6, in order to describe the above reason. In the present embodiment, $V_{cc}$, for instance, 1.0 V is applied to each of a drain D and a gate G of the FET. Then, the semiconductor memory device starts writing, and thereby, a potential of a source (S) goes up as is shown in a graph of FIG. 7B. As the potential at the point (S) goes up, a voltage difference between a point (G) and the point (S) decreases. FIG. 7C illustrates characteristics of voltage ($V_{DS}$)-current ($I_{DS}$) in a general transistor. Characteristic of the voltage ($V_{DS}$)-current ($I_{DS}$) in a saturated region in the graph of FIG. 7C is generally expressed by the following equation (1):

$$I_{DS}=\beta*(1+\lambda*V_{DS})/2*(V_{GS}-V_{TH})^2 \quad \text{Expression (1)}$$

wherein β and λ are certain constants.

It is understood from FIG. 7C and the Expression (1) that as a potential difference between the points (G) and (S) decreases, an electric current passing between the points also decreases. In other words, when the potential difference between the points (G) and (S) decreases to a threshold voltage $V_{TH}$ of a transistor, the electric current stops flowing in between the points, so that the potential at the point (S) is determined by the threshold voltage $V_{TH}$ and a gate voltage. Accordingly, when the potential of the point (G) and a potential of a point (D) are set as in the present embodiment, the potential of the point (S) is suppressed to the potential lower than the potential of the point (G) by a value of the $V_{TH}$. For instance, when the threshold voltage $V_{TH}$ is 0.5 V, the potential at the point (S) becomes 0.5 V which can provide a reference voltage necessary for reading out a datum in a memory cell.

The threshold voltage of the transistor in the reference cell is preferably in the same level as that of the transistor in the memory cell when the transistors are manufactured, but the transistors may have different threshold voltage from each other if it is necessary for obtaining a desired reference voltage.

Figure 8:
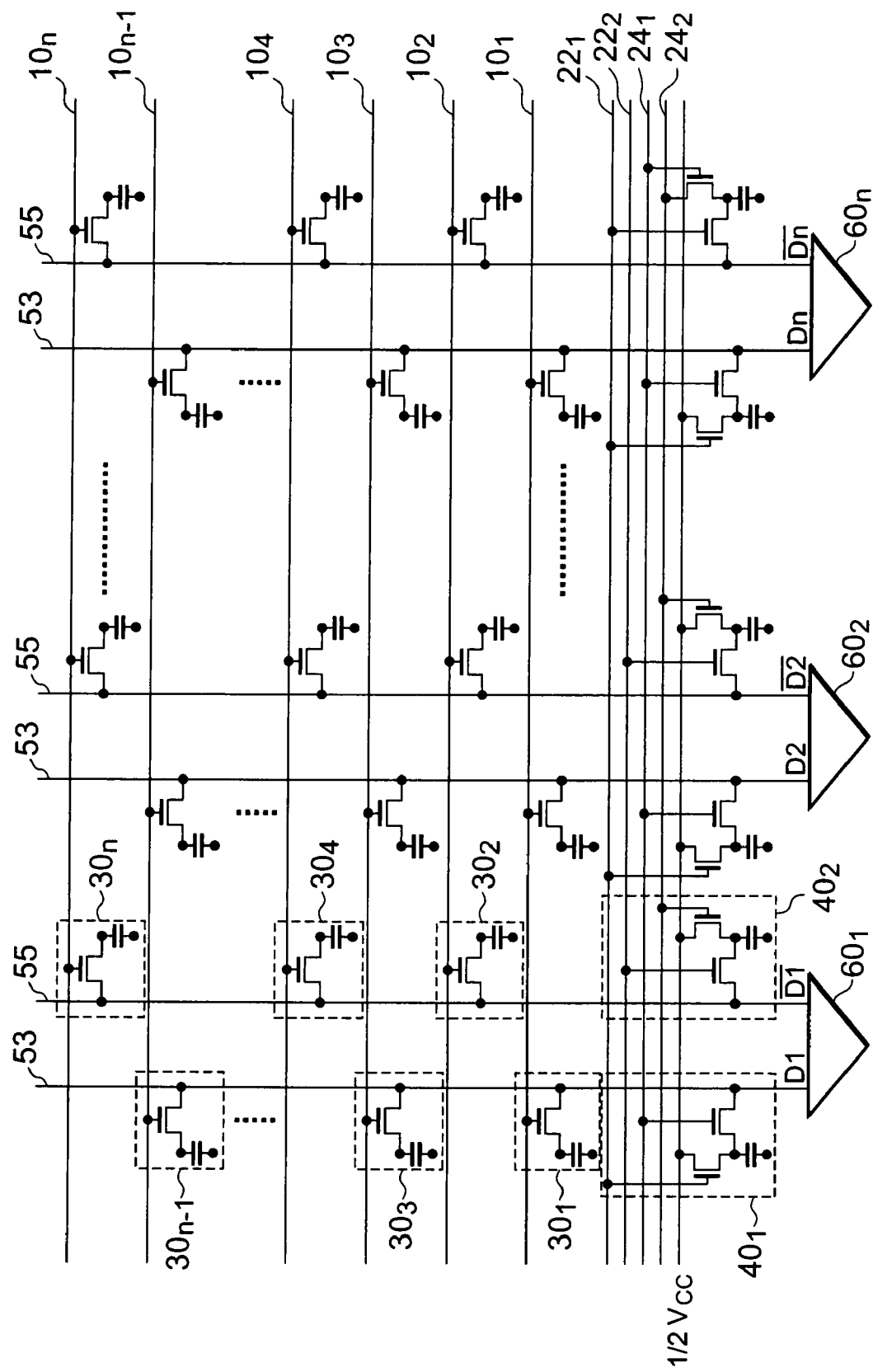
FIG. 8 is a circuit diagram illustrating a modified example of an embodiment.
Figure 9:
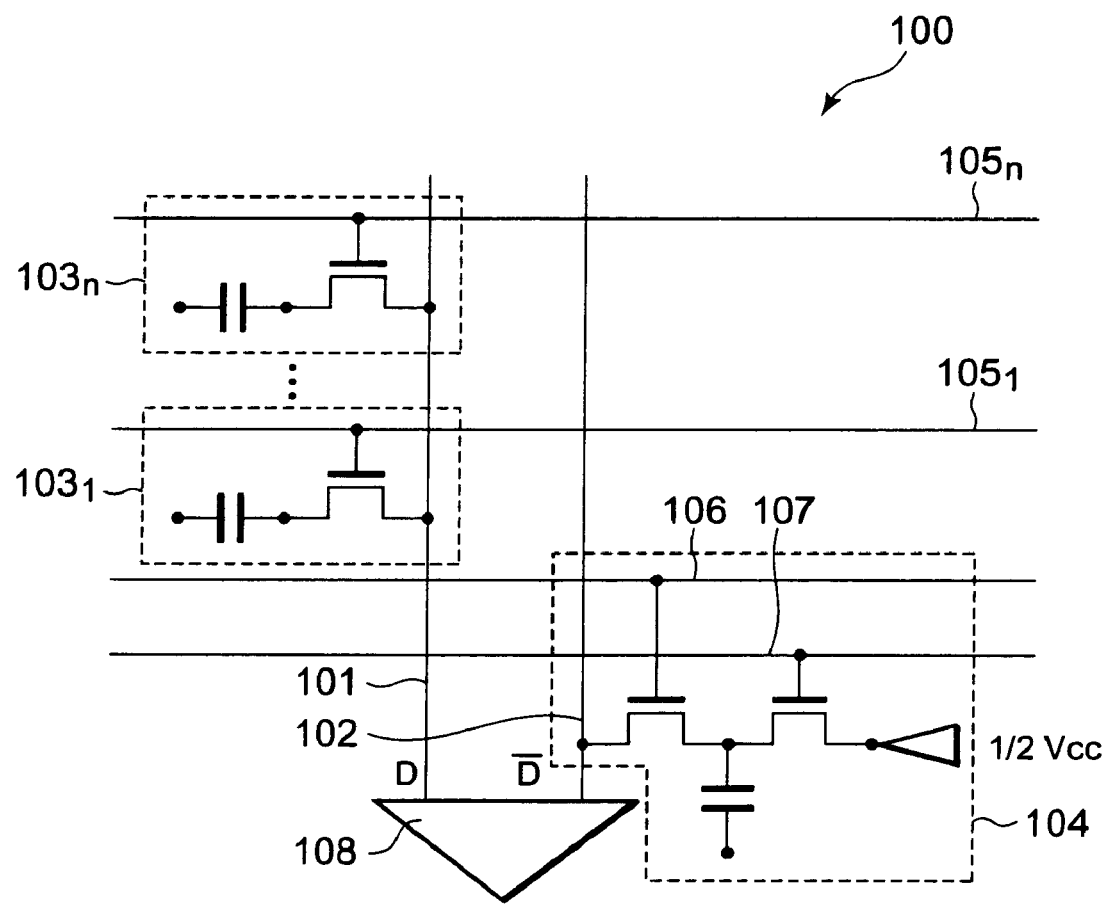
FIG. 9 is a circuit diagram illustrating a conventional semiconductor memory device.

A semiconductor memory device according to the present invention is not limited to the above described embodiment but can be variously modified. For instance, the semiconductor memory device illustrated in FIG. 1 has one sense amplifier 60, but may have a plurality of sense amplifiers $60_1$ to $60_n$ as are illustrated in FIG. 8. The sense amplifier $60_1$ has an input terminal to which digit lines 53 and 55 are connected. To these digit lines 53 and 55, memory cells $30_1$ to $30_n$ are alternately connected. Specifically, the memory cells $30_1$, $30_3$ to $30_{n-1}$ are connected to the digit line 53, and the memory cells $30_2$, $30_4$ to $30_n$ are connected to the digit line 55.

In addition, to the digit lines 53 and 55, reference cells $40_1$ and $40_2$ are connected respectively. A word line $22_1$ for readout and a word line $24_1$ for writing are connected to the reference cell $40_1$, and a word line $22_2$ for readout and a word line $24_2$ for writing are connected to the reference cell $40_2$. When reading out the memory cells $30_1$, $30_3$ to $30_{n-1}$, the semiconductor memory device uses the reference cell $40_1$, and when reading out the memory cells $30_2$, $30_4$ to $30_n$, the semiconductor memory device uses the reference cell $40_2$. Up to now, a configuration of the sense amplifier $60_1$ has been described, but the other sense amplifiers $60_2$ to $60_n$ have the same configuration.

In addition, an example of having applied the present invention to a DRAM was shown in the above described embodiments, but the present invention can be applied to the entire spectrum of a semiconductor memory device which is provided with a 1T1C-type memory cell and is a type of reading out a datum from the memory cell by comparing the datum with that in a reference cell. Such a semiconductor memory device includes an FeRAM (Ferroelectric RAM) and an MRAM (Magnetoresistive RAM) in addition to the DRAM.

It is apparent that the present invention is not limited to the above embodiments, but may be modified and changed without departing from the scope and spirit of the invention.

What is claimed is:

1. A semiconductor memory device, comprising:
   a first word line;
   a second word line;
   a memory cell connected to said first word line;
   a reference cell connected to said second word line; and
   a third word line connected to said reference cell,
   wherein:
   a second writing potential applied to said second word line upon a data writing operation is lower than a first writing potential applied to said first word line upon the data writing operation,
   a voltage for giving said second writing potential and a voltage applied in said reference cell are equal to a power supply voltage (Vcc),
   the data writing operation comprises applying said second writing potential to said second word line, and
   a data reading operation comprises applying a third readout potential to said third word line.

2. The semiconductor memory device according to claim 1, further comprising a sense amplifier, wherein
   a voltage of said memory cell is compared with a voltage of said reference cell in said sense amplifier upon a data reading operation.

3. The semiconductor memory device according to claim 1, further comprising:
   a first digit line connected to a first input terminal of a sense amplifier; and
   a second digit line connected to a second input terminal of said sense amplifier, wherein
   said memory cell is connected to said first digit line, and
   said reference cell is connected to said second digit line.

4. The semiconductor memory device according to claim 1, further comprising:
   a first potential circuit for giving said first writing potential to said first word line; and
   a second potential circuit for giving said second writing potential to said second word line.

5. The semiconductor memory device according to claim 1, wherein a first readout potential applied to said first word line upon a data reading operation and a second readout potential applied to said second word line upon a data reading operation are equal to said first writing potential applied to said first word line upon the data writing operation.

6. The semiconductor memory device according to claim 1, further comprising:
a first transistor in the memory cell; and
a second transistor in the reference cell,
wherein said first transistor and said second transistor have threshold voltages different from each other.

7. The semiconductor memory device according to claim 1, wherein said third readout potential comprises a voltage equal to said power supply voltage (Vcc).

8. The semiconductor memory device according to claim 1, wherein said third readout potential comprises a voltage equal to said first writing potential.

9. The semiconductor memory device according to claim 1, wherein said power supply voltage (Vcc) comprises a voltage less than 0.7 times said first writing potential.

10. The semiconductor memory device according to claim 1, wherein said third readout potential comprises a voltage at least 0.7 times a first readout potential applied to said first word line but less than said first readout potential.

11. The semiconductor memory device according to claim 1, further comprising:
a first transistor in the memory cell; and
a second transistor in the reference cell,
wherein said first transistor and said second transistor have a same threshold voltage.

12. The semiconductor memory device according to claim 1,
wherein said reference cell comprises a transistor, and
a reference voltage stored in said reference cell is equal to said power supply voltage (Vcc) minus a gate-source threshold voltage of said transistor.

13. The semiconductor memory device according to claim 1, further comprising:
a first transistor in said reference cell having a drain connected to said power supply voltage (Vcc);
a second transistor in said reference cell having a drain connected to a source of said first transistor; and
a capacitor in said reference cell connected between ground and said commonly connected source of said first transistor and drain of said second transistor,
wherein said second word line is connected to a gate of said first transistor in said reference cell, and
said third word line is connected to a gate of said second transistor in said reference cell.

14. The semiconductor memory device according to claim 1,
wherein said memory cell further comprises a plurality of N (N is an integer) memory cells,
said first word line further comprises a plurality of N first word lines respectively connected to said plurality of N memory cells, and
said reference cell comprises at most one said reference cell.

15. The semiconductor memory device according to claim 2, wherein said sense amplifier compares a voltage accumulated in said memory cell with a voltage accumulated in said reference cell to determine which is higher and outputs a result of said determining.

16. The semiconductor memory device according to claim 3, wherein a voltage applied to said first digit line, a voltage applied to said second digit line, a voltage applied to said word line in a data writing operation, and a reference voltage applied to said reference cell are equal to a same power supply voltage (Vcc).

17. The semiconductor memory device according to claim 6, wherein a threshold voltage of said reference cell has a voltage level at least that of a threshold voltage of said memory cell.

18. The semiconductor memory device according to claim 13,
a reference voltage stored in said capacitor in said reference cell is equal to said power supply voltage (Vcc) minus a gate-source threshold voltage of said first transistor in said reference cell.

* * * * *